US009419087B2

(12) United States Patent
Hu et al.

(10) Patent No.: US 9,419,087 B2
(45) Date of Patent: Aug. 16, 2016

(54) BIPOLAR JUNCTION TRANSISTOR FORMED ON FIN STRUCTURES

(71) Applicant: Taiwan Semiconductor Manufacturing Company, Ltd., Hsin Chu (TW)

(72) Inventors: Chia-Hsin Hu, Changhua (TW); Sun-Jay Chang, Hsinchu (TW); Min-Chang Liang, Zhu-Dong Town (TW); Shien-Yang Wu, Jhudong Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 165 days.

(21) Appl. No.: 14/071,239

(22) Filed: Nov. 4, 2013

(65) Prior Publication Data

US 2015/0123246 A1    May 7, 2015

(51) Int. Cl.
| | |
|---|---|
| *H01L 29/735* | (2006.01) |
| *H01L 29/423* | (2006.01) |
| *H01L 27/06* | (2006.01) |
| *H01L 29/417* | (2006.01) |
| *H01L 29/66* | (2006.01) |
| *H01L 29/732* | (2006.01) |
| *H01L 21/8249* | (2006.01) |

(52) U.S. Cl.
CPC ...... *H01L 29/42304* (2013.01); *H01L 27/0623* (2013.01); *H01L 29/41708* (2013.01); *H01L 29/66272* (2013.01); *H01L 29/732* (2013.01); *H01L 21/8249* (2013.01)

(58) Field of Classification Search
CPC .............. H01L 2924/00; H01L 29/732; H01L 21/8249; H01L 29/0804; H01L 29/7322
USPC ........... 257/E21.696, 197, E29.184, E21.379, 257/E27.015, E29.03, E29.174, E29.182, 257/273, 565, E27.019, E29.197, 370, 526, 257/E21.608, E27.074; 438/309, 234, 202, 438/325, 327
See application file for complete search history.

(56) References Cited

U.S. PATENT DOCUMENTS

| 6,177,325 B1 * | 1/2001 | Jang ..................... H01L 29/0804 257/E21.379 |
| 6,218,254 B1 * | 4/2001 | Singh ................ H01L 29/66068 257/E21.066 |
| 6,246,103 B1 * | 6/2001 | Yu ........................ H01L 29/7311 257/557 |
| 2005/0151159 A1 * | 7/2005 | Ma ....................... H01L 29/0692 257/152 |

* cited by examiner

*Primary Examiner* — David Vu
*Assistant Examiner* — Jonathan Han
(74) *Attorney, Agent, or Firm* — Haynes and Boone, LLP

(57) ABSTRACT

A Bipolar Junction Transistor (BJT) includes an elongated collector line, an elongated emitter line parallel to the collector line, and an elongated base line parallel to the collector line and positioned between the collector line and the base line. The emitter line, the base line, and the collector line are formed over fin structures.

20 Claims, 7 Drawing Sheets

BIPOLAR JUNCTION TRANSISTOR FORMED ON FIN STRUCTURES

BACKGROUND

Integrated circuits include several types of components, particularly transistors. Various types of transistors may be formed using various techniques. Two examples of transistors are a Metal Oxide Semiconductor Field Effect Transistor (MOSFET) and a Bipolar Junction Transistor (BJT). Both devices have various advantages and disadvantages that make one type of device preferable in some cases and not preferable in other cases.

MOSFET devices include a gate structure on top of a semiconductor substrate. Both sides of the gate structure are then doped to form source and drain regions. A channel is formed between the source and drain regions beneath the gate. Based on the voltage bias applied to the gate, electric current may either be allowed to flow through the channel or be inhibited from doing so.

In some cases, the channel may be formed using a fin structure. The fin structure extends out of the substrate and runs perpendicular to the gate structure formed on the substrate and fin structures. Such devices are sometimes referred to as finFET devices. FinFETs provide various advantages which are outside the scope of the present discussion.

Typical BJT layouts include concentric, polygonal rings surrounding a solid polygonal piece in the middle. The solid piece in the middle is typically the emitter terminal. A first polygonal ring surrounding the solid piece is the base terminal, and a second polygonal ring surrounding the first polygonal ring is the collector terminal. In such a structure, electric current flowing between the emitter terminal and the collector terminal flows in many directions from the inner solid piece in an outward direction towards the polygonal rings.

It may be beneficial to have a circuit that utilizes both MOSFET type devices and BJT type devices. However, because different processes are typically used to form BJT devices, having both BJT and MOSFET type devices in the same circuit can be more costly and time consuming to produce. Therefore, it is desirable to have an efficient BJT structure that is compatible with the finFET fabrication process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
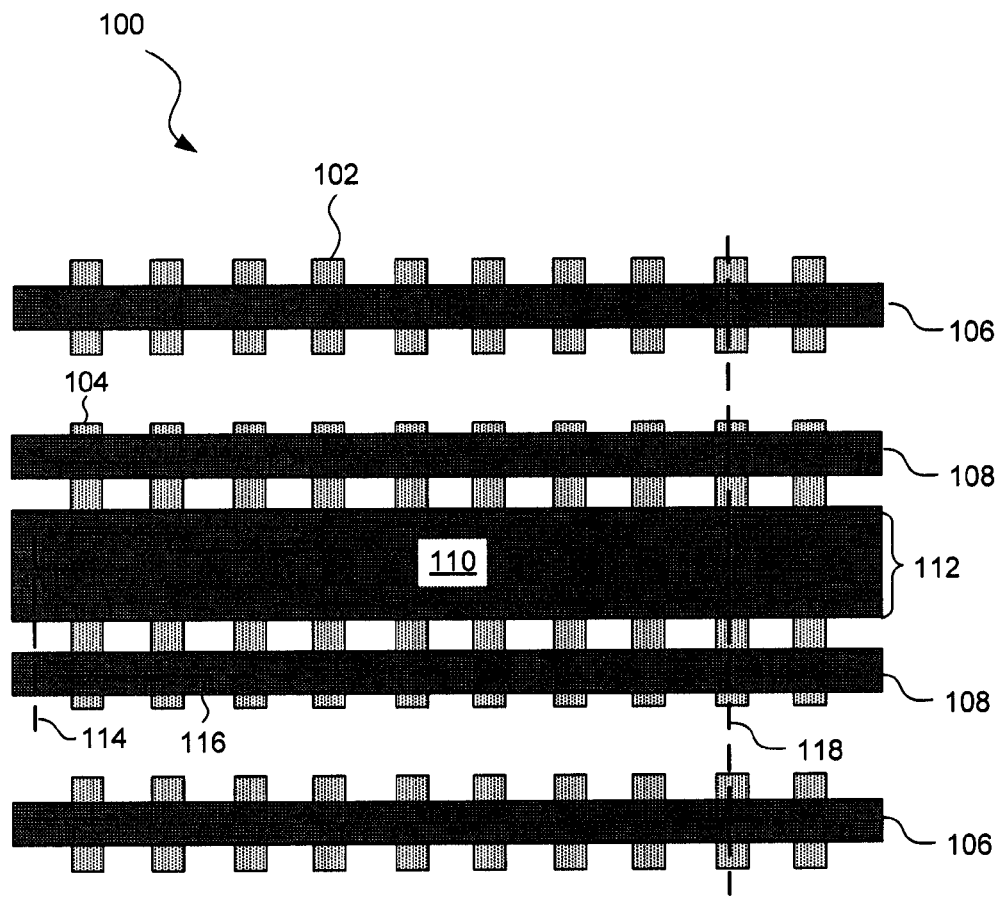
FIG. 1 is a diagram showing an illustrative top view of a BJT device, according to one example of principles described herein.

FIG. 1 is a diagram showing an illustrative top view of a BJT device 100. According to the present example, the BJT device 100 includes an emitter line 110, base lines 108, and collector lines 106. The emitter line 110 connects to an emitter terminal (not shown) of the BJT device 100, the collector line 106 connects to a collector terminal (not shown) of the BJT device, and the base line 108 connects to a base terminal (not shown) of the BJT device 100. All lines 106, 108, 110, are formed on top of fin interconnect structures 102, 104. As will be described in further detail below, the fin interconnect structures 102, 104 are referred to as such because they connect the emitter line 110, collector lines 106, and base lines 108 to underlying fin structures (not shown) formed into the substrate.

The layout of the BJT device 100 illustrated in FIG. 1 is different from a typical BJT device layout. As mentioned above, a typical BJT layout includes concentric polygonal structures that form the collector, emitter, and base terminals. In such a structure, electric current flowing between the emitter terminal and the collector terminal flows in many directions from the inner solid piece in an outward direction towards the polygonal rings.

In this example, however, the BJT device 100 is structured so that electric current flows along a single axis. Specifically, the electric current will flow in a direction that is perpendicular to the elongated direction of the collector lines 106, base lines 108, and emitter line 110. This increases the current efficiency of the BJT device 100.

According to the present example, the collector line 106 is an elongated, conductive line. A BJT device is a three-terminal device that includes the collector, the base, and the emitter. A BJT device can act as a switch. When doing so, the voltage applied at the base determines whether electric current can flow between the emitter and the collector. The collector line 106 rests on top of a first set of fin interconnect structures 102. In some examples, the BJT device 100 may include two collector lines 106. Both collector lines 106 surround the emitter line 110 and the base lines 108.

According to the present example, the base line 108 is an elongated, conductive line that runs parallel to the collector line 110. The base line 108 is on a different set of fin interconnect structures 104. In the present example, the BJT device 100 includes two base lines 108, each placed on both sides of the emitter line 110.

According to the present example, the emitter line 110 is an elongated, conductive line that runs parallel to both the collector line 106 and the base line 108. The emitter line 108 is on the same set of fin interconnects 104 as the base line 108. This can help bias the BJT device 100 and increase its efficiency.

As mentioned above, the fin interconnect structures 102, 104 connect the emitter line 110, collector lines 106, and base lines 108 to underlying fin structures (not shown). The fin structures will be described in further detail below. The fin interconnects 102, 104 run perpendicular to the collector lines 106, base lines 108 and emitter line 110 formed on the fin interconnect structures 102, 104. The fin interconnect structures 102 underneath the collector line are not connected to the fin interconnect structures 104 underneath the emitter line 110 and the base lines 108. The fin interconnect structures 102, 104 may be made of the same material used to make gate structures in MOSFET devices. In one example, this material may be polysilicon. In some examples, the fin interconnect structures may be made of other materials such as metal materials.

FIG. 1 includes a number of dotted lines. The dotted lines represent the locations of cross sectionals used in subsequent figures. Specifically, dotted line 114 corresponds to FIG. 3A, dotted line 116 corresponds to FIG. 3B, and dotted line 118 corresponds to FIG. 2.

Figure 2:
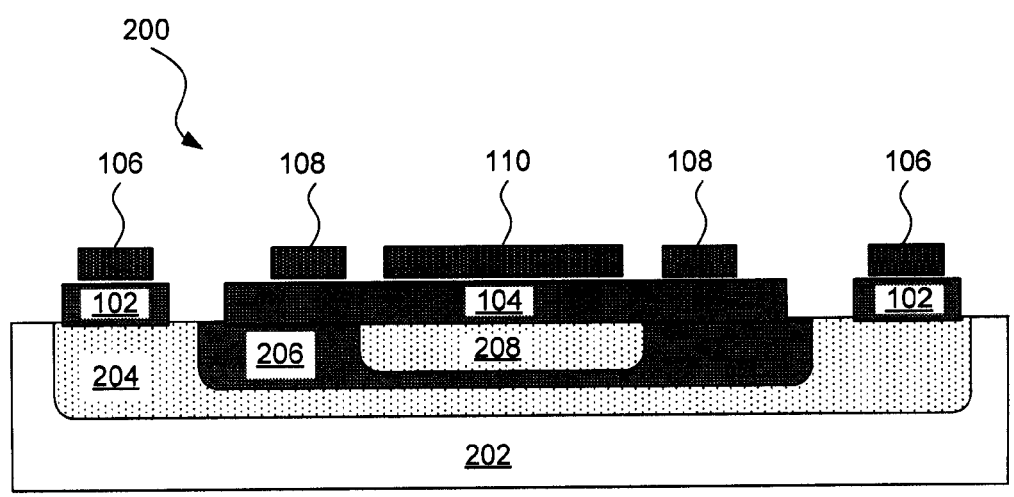
FIG. 2 is a diagram showing an illustrative side view of a BJT device, according to one example of principles described herein.

FIG. 2 is a diagram showing an illustrative side view 200 of a BJT device. According to the present example, the BJT device 100 is formed on a substrate 202. The substrate 202 has a first doped region 204, a second doped region 206 within the first doped region 204, and a third doped region 208 within the second doped region 206.

The first doped region 204 connects to the first set of fin structures 102 that connect to the collector lines 106. The doped region 204 may include fin structures (not shown) that are doped similarly to the first doped region 204. The second doped region 206 connects to the fin interconnect structures 104 at regions below the base lines 108. The third doped region 208 connects to the fin interconnect structures 104 below the emitter line 110.

The first doped region 204 and the third doped region 208 are both either a p-type or n-type material. The second doped region 206 is the opposite for the first doped region 204 and the third doped region 208. For example, if the BJT device 100 is a PNP transistor, then the first doped region 204 and the third doped region 208 are p-type regions while the second doped region 206 is an n-type region. Conversely, if the BJT device 100 is an NPN transistor, then the first doped region 204 and the third doped region 208 are n-type regions while the second doped region 206 is a p-type region.

Figure 3A:
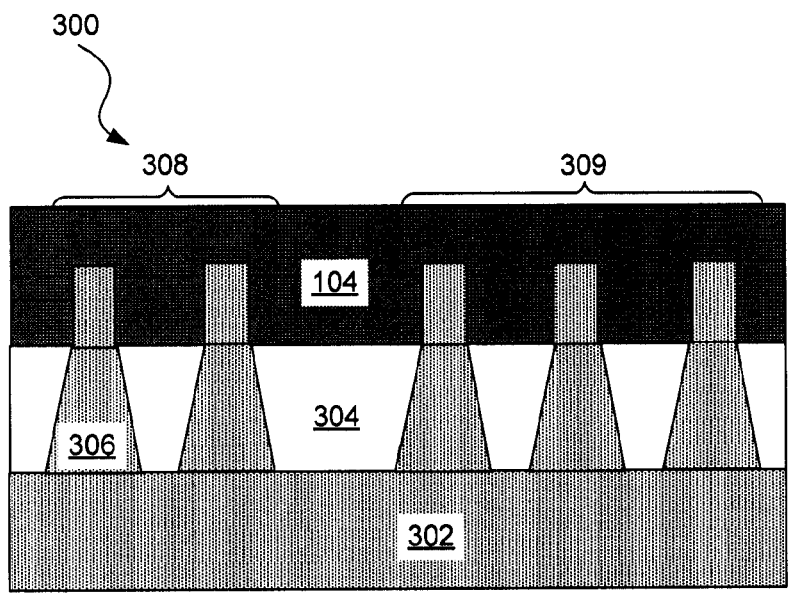
FIGS. 3A and 3B are diagrams illustrating cross-sections of a BJT device, according to one example of principles described herein.
Figure 3B:
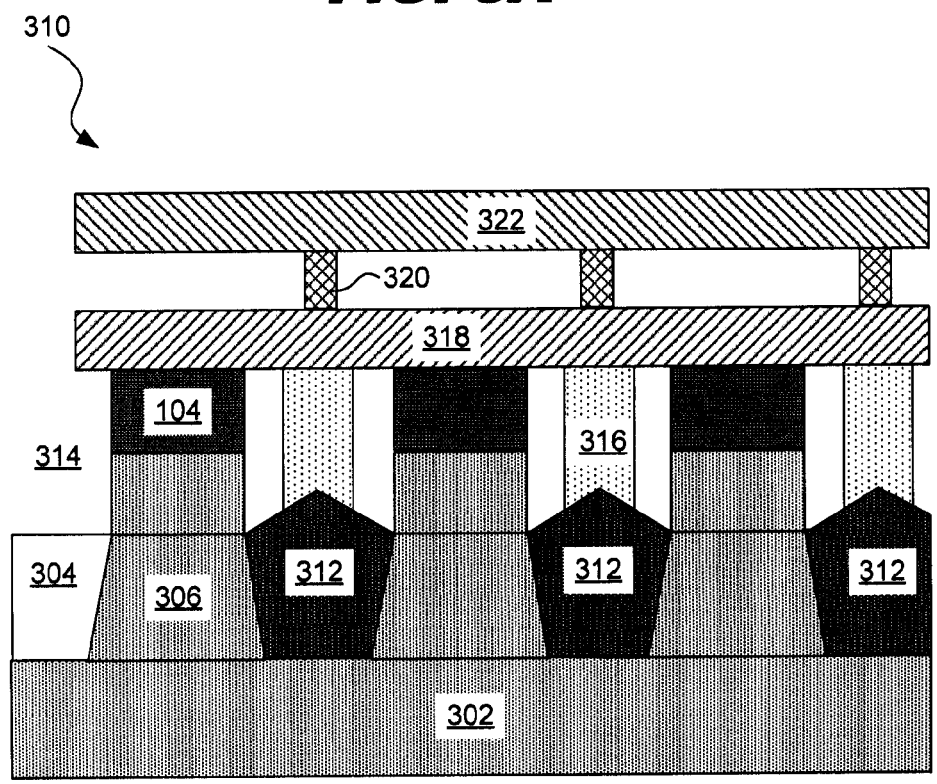

FIGS. 3A and 3B are diagrams illustrating cross-sections of a BJT device. FIG. 3A is a cross-sectional view 300 corresponding to the dotted line 114 of FIG. 1. For purposes of discussion, different doping types are not illustrated and discussed with respect to this view 300. FIG. 3A illustrates a set of fin structures 306 formed on a substrate 302.

According to the present example, a Shallow Trench Isolation (STI) structure 304 is formed between the fin structures 306. In one example, the lower portion of the fin structures are formed first by etching trenches in which to form the STI material 304. The STI material 304 is a type of dielectric material used to isolate features within integrated circuits from adjacent features. Then, the upper portion of the fin structures 306 may be formed through various photolithographic processes. In one example, epitaxial methods may be used to form the upper portions of the fin structures 306.

After the fin structures 306 are formed, the fin interconnect structures 104 are formed over the fin structures 306. The fin interconnect structures 104 may be made of a polysilicon material. As mentioned above, this material is the same type of material that is typically used for gate structures of MOSFET device. Thus, formation of the fin interconnect structures may be done at the same type as formation of the gate structures elsewhere within the integrated circuit layer.

In this example, the left two fin structures 308 correspond to the fin structures 306 underneath the base line. The right three fin structures 309 correspond to the fin structures underneath the emitter line. Thus, the two sets of fin structures 308, 309 will be doped differently.

FIG. 3B is a diagram showing an illustrative cross sectional view 310 of a BJT device that corresponds with the dotted line 116 of FIG. 1. Thus, FIG. 3B illustrates the underlying fin structures 306 and substrate 302 underneath the base line. Because each of the fin structures shown in FIG. 3B is underneath the same line, the doping type of the underlying fin structures 306 and substrate 302 is the same.

According to the present example, an epitaxial structure 312 is formed in the trenches between the fin structures 306. The epitaxial structures are grown through an epitaxial growth process. The epitaxial structures 312 are doped with the same type of doping material as the underlying structure, but with a different doping concentration. This helps form a better connection between the substrate 302 and the metal vias 316 used to connect the substrate to the metal line 318, in this case the base line.

After the epitaxial structures 312 are formed, and after the fin interconnect structures 104 are formed, an Interlayer Dielectric (ILD) 314 is formed. Then, holes are formed within the ILD where the vias 316 are to be formed. The holes can then be filled with a conductive material such as a metal material in order to form the vias 316. In some cases, this metal material may be filled during the same process used to form the metal line 318.

In some cases, it may be desirable to connect the metal line 318 to a different metal line 322 on another layer. For various circuit routing purposes, the metal line immediately on top of the fin interconnects 104 may connect to an upper metal line 322. The upper metal line 322 may be routed to the correct terminal. For example, if the lower metal line 318 is the base line, then the upper metal line 322 may be routed to the base terminal of the BJT device. The upper metal line 322 is connected to the lower metal line 318 through a number of vias 320. These upper vias 320 are shown being aligned with the lower vias 316 that connect to the epitaxial structures 312. In some examples, however, the upper vias 320 do not necessarily have to be aligned with the lower vias 316.

Figure 4A:
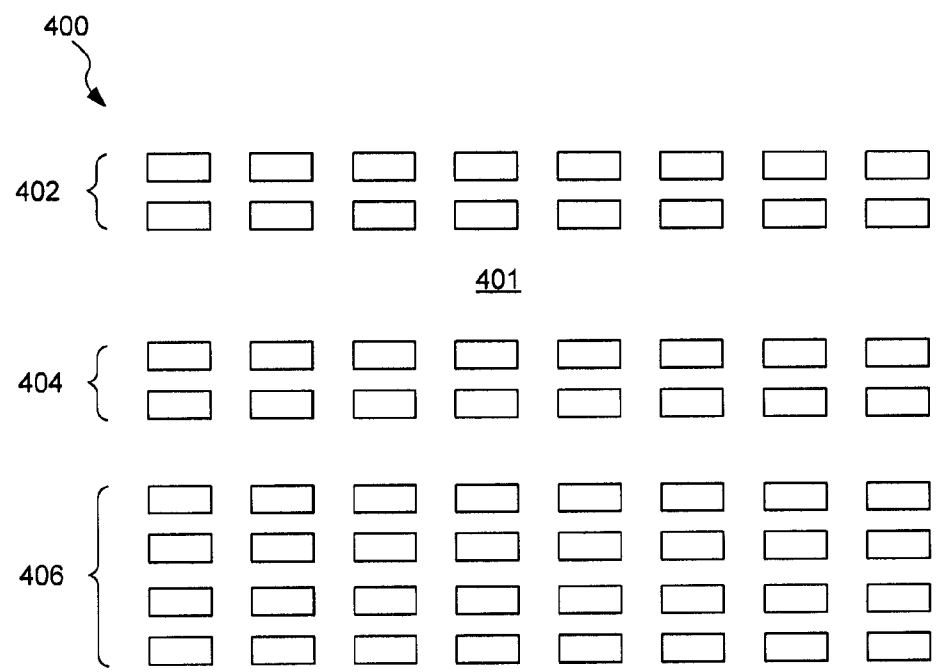
FIGS. 4A-4C are diagrams illustrating formation of a BJT device from a top view perspective, according to one example of principles described herein.
Figure 4B:
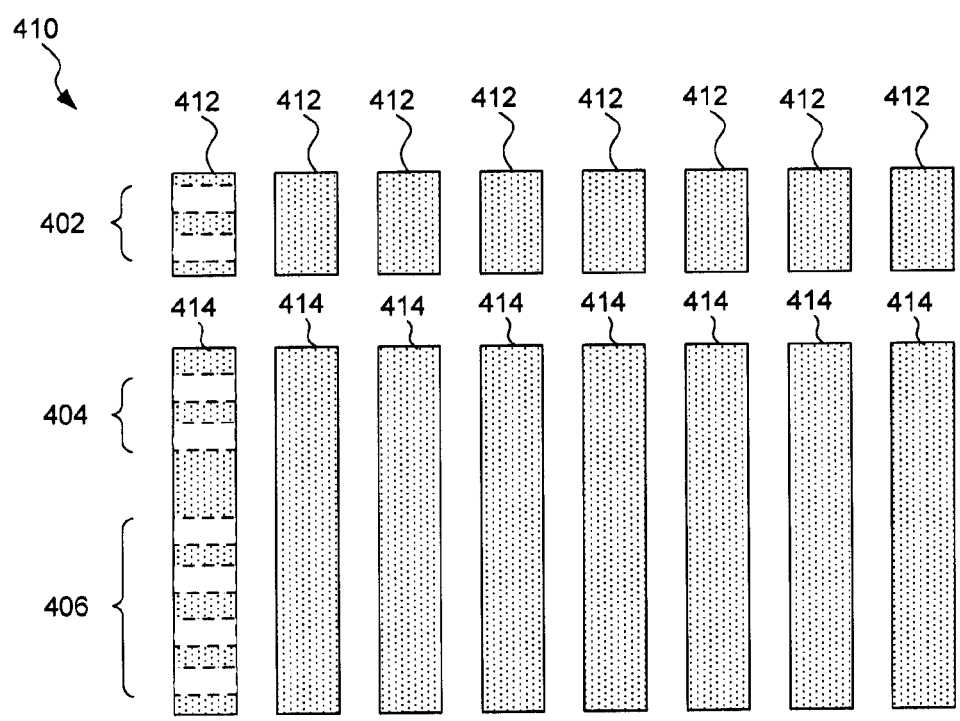
Figure 4C:
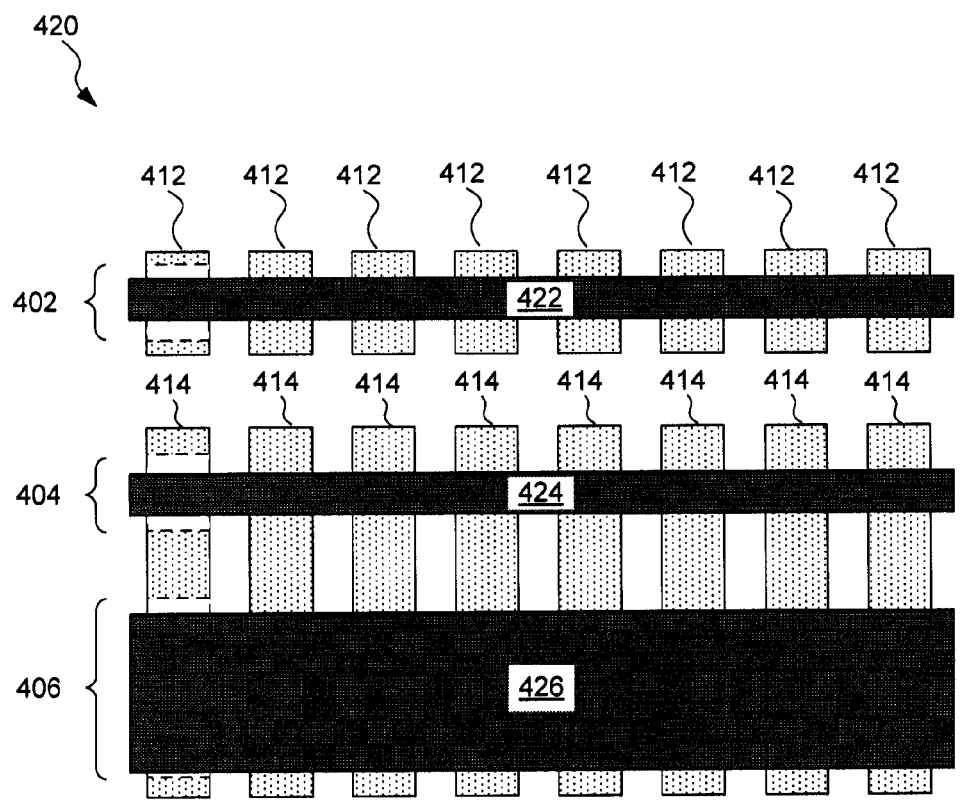

FIGS. 4A-4C are diagrams illustrating formation of a BJT device from a top view perspective. According to the present example, a series of fin structures are formed on top of a substrate 401. There is a first array 402 of fin structures, a second array 404 of fin structures, and a third array 406 of fin structures. As will be illustrated further below, the first array 402 of fin structures corresponds to where a collector line is to be formed. The second array 404 of fin structures corresponds to where a base line is to be formed. The third array 406 of fin structures corresponds to where an emitter line is to be formed.

As mentioned above, fin structures are often used in MOSFET device fabrication. In the present example, the fin structures are doped similarly to the underlying substrate. Thus, if a fin structure is over a p-type region of the substrate, then that fin structure will also be p-type. Or, if fin structure is over an n-type region, then that fin structure will also be n-type.

FIG. 4B illustrates a top view 410 of the BJT device after fin interconnect structures 412, 414 have been formed. The fin interconnect structures 412, 414 are similar to gate structures of a MOSFET device. Thus, the fin interconnect structures 412, 414 may be made of a conductive material such as polysilicon. A first set of fin interconnect structures 412 are formed over the first array 402 of fin structures. Additionally, a second set of fin structures 414 is formed over the second array 404 and third array 406 of fin structures. The fin interconnect structures 412, 414 are positioned so that they run perpendicular to the longest dimension of the fin structures.

FIG. 4C is a diagram showing an illustrative top view 420 of a BJT device after conductive lines have been formed. According to the present example, a first conductive line 422 is formed over the first array 402 of fin structures and the first set of gate-like fin interconnect structures 412. The first conductive line 422 is used to connect to the collector terminal of the BJT device and will thus be referred to as the collector line 422. The collector line 422 is electrically connected to the underlying fin structures of the first array 402.

Additionally, a second conductive line 424 is formed over the second array 404 of fin structures. This conductive line 424 connects to the base terminal and will thus be referred to as the base line 424. The base line is electrically connected to the underlying fin structures of the second array 404. A third conductive line 426 is formed over the third array 406 of fin structures. The third conductive line 426 connects to the emitter terminal and will thus be referred to as the emitter line 426. The emitter line is electrically connected to the underlying fin structures of the third array 406.

Figure 5:
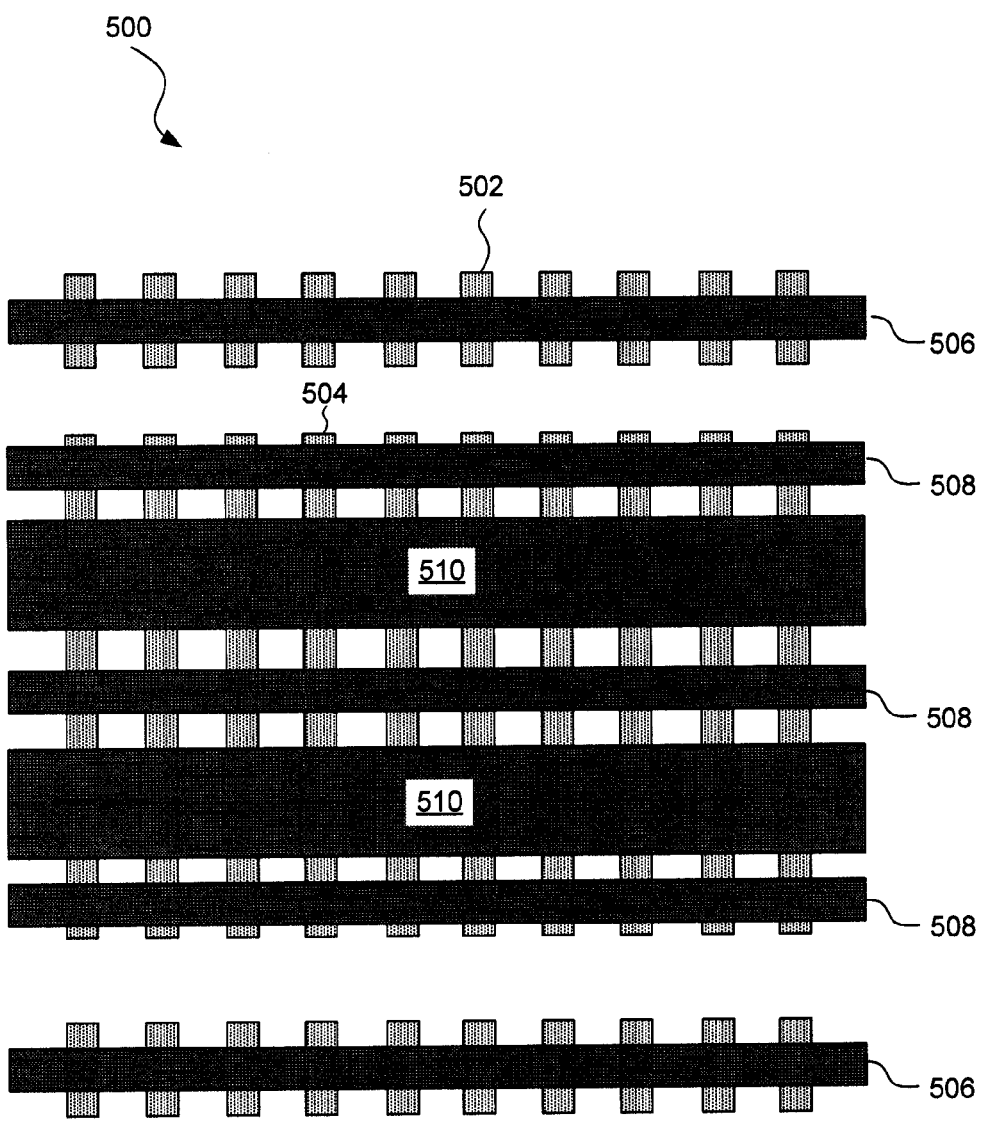
FIG. 5 is a diagram showing an illustrative top view of a BJT device with multiple emitter lines, according to one example of principles described herein.

FIG. 5 is a diagram showing an illustrative top view of a BJT device 500 with multiple emitter lines 510. In some examples, a BJT device may have two or more emitter lines. The BJT device 500 may have additional base lines 508 as well. In one example, the number of base lines 508 is one more than the number of emitter lines 510. The number of collector lines 506 may remain at two. Having additional emitter lines 510 and base lines 508 can allow for different device characteristics. For example, some applications may require larger BJT devices that can handle more current. The additional emitter lines 510 and base lines 508 may allow for larger current capacity.

Figure 6:
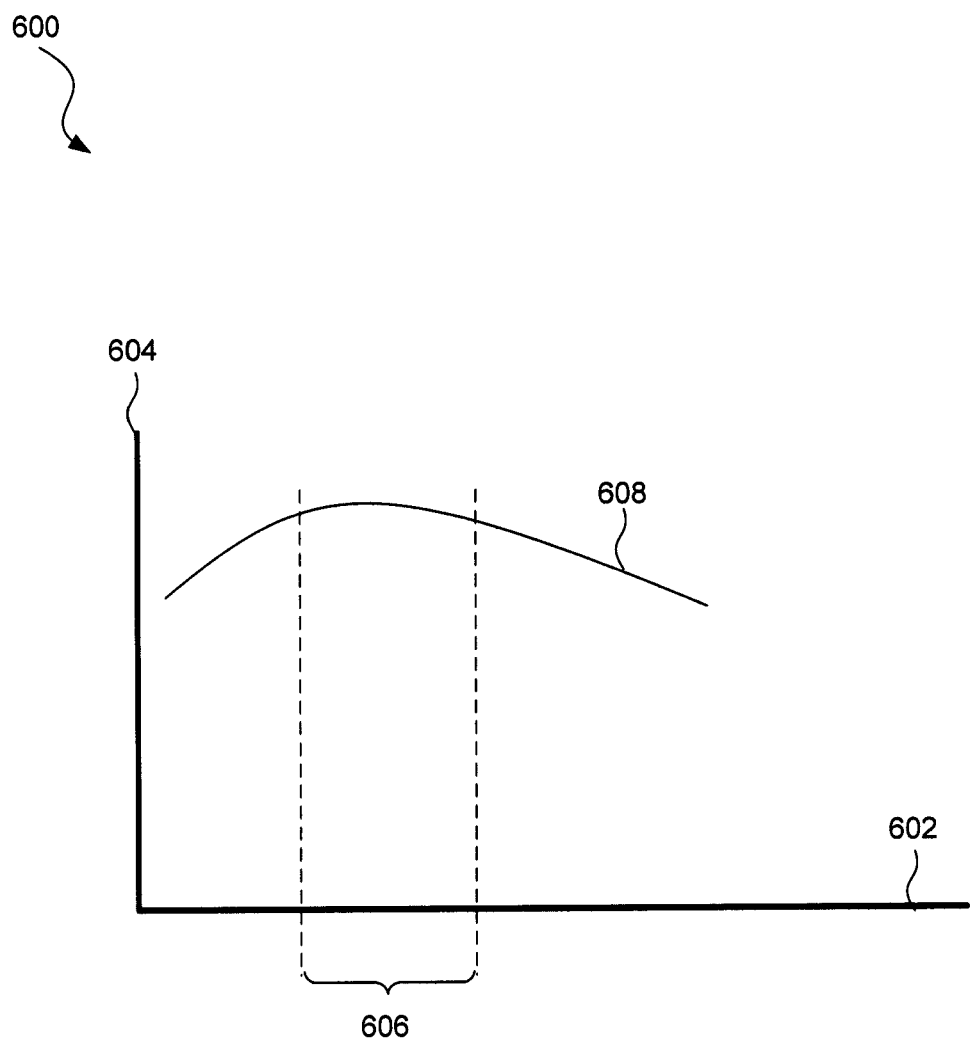
FIG. 6 is a graph showing current efficiency with respect to emitter width, according to one example of principles described herein.

FIG. 6 is a graph showing current efficiency with respect to emitter width. According to the present example, the horizontal axis 604 represents current efficiency and the vertical axis 602 represents emitter width. The curve 608 thus shows the current efficiency at various emitter widths.

The emitter width may be selected based on analysis of the curve 608. For example, it may be desirable to have a BJT device with a current efficiency above a certain threshold. By looking at the curve, a range 606 of emitter widths that have a current efficiency above the desired threshold may be determined. In one example, the range may be between 0.2 and 0.7 micrometers.

Current efficiency may be measured in different ways. In one example, the current efficiency can be measured by the beta value. The beta value is the collector current over the base current. Another method is the alpha value, which is the collector current over the emitter current. The emitter width can be selected based on desired beta or alpha values.

Figure 7:
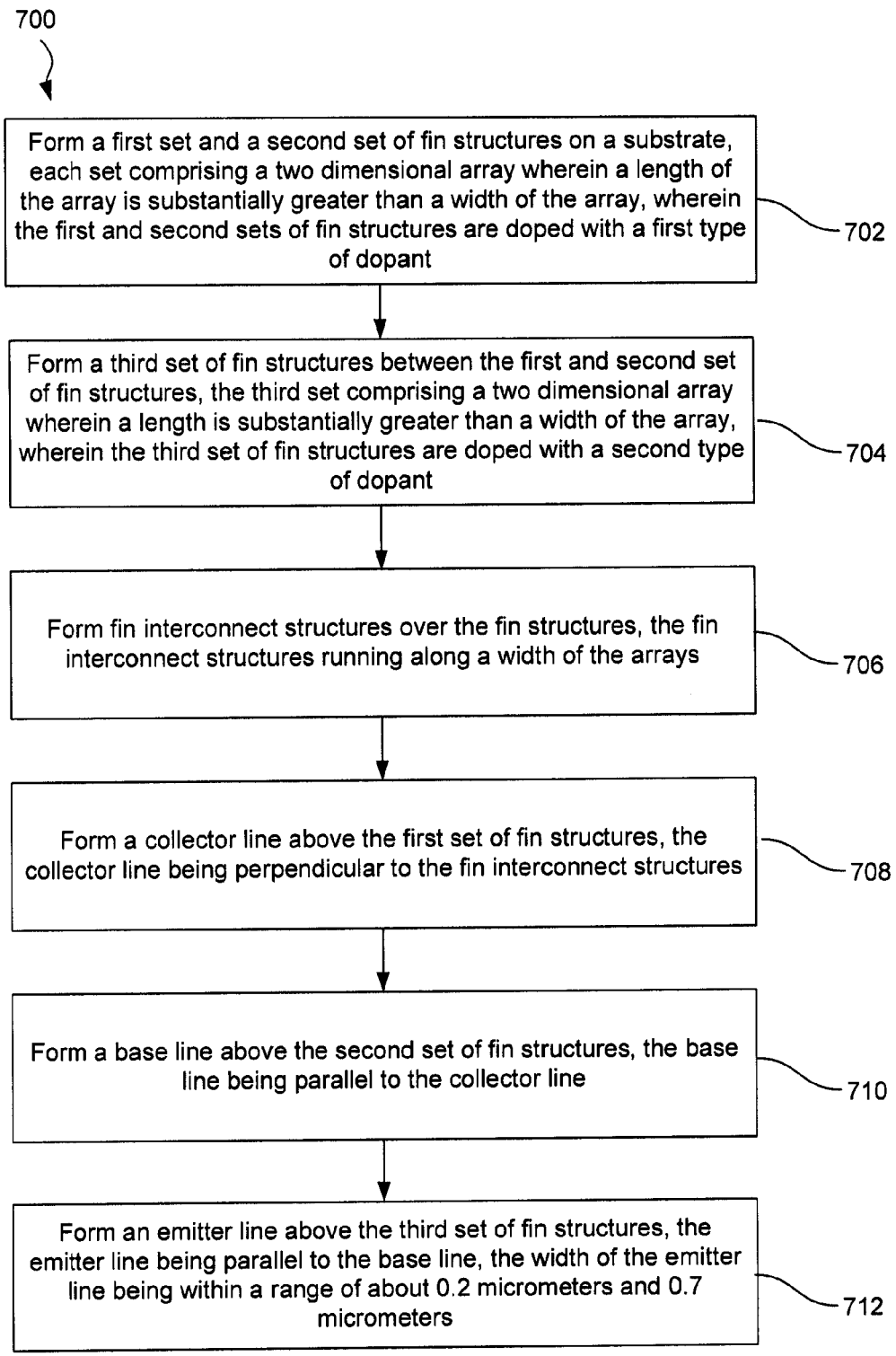
FIG. 7 is a flowchart showing an illustrative method for forming a BJT device, according to one example of principles described herein.

FIG. 7 is a flowchart showing an illustrative method for forming a BJT device. According to the present example, the method includes a step for forming 702 a first set and a second set of fin structures on a substrate, each set comprising a two dimensional array wherein a length of the array is substantially greater than a width of the array, wherein the first and second sets of fin structures are doped with a first type of dopant. The method 700 further comprises a step for forming 704 a third set of fin structures between the first and second set of fin structures, the third set comprising a two dimensional array wherein a length is substantially greater than a width of the array, wherein the third set of fin structures are doped with a second type of dopant. The method 700 further comprises a step for forming 706 fin interconnect structures over the fin structures, the fin interconnect structures running along a width of the arrays. The method 700 further comprises a step for forming 708 a collector line above the first set of fin structures, the collector line being perpendicular to the fin interconnect structures. The method 700 further comprises a step for forming 710 a base line above the second set of fin structures, the base line being parallel to the collector line. The method 700 further comprises forming 712 an emitter line above the third set of fin structures, the emitter line being parallel to the base line, the width of the emitter line being within a range of about 0.2 micrometers and 0.7 micrometers.

According to certain illustrative examples, a Bipolar Junction Transistor (BJT) includes an elongated collector line, an elongated emitter line parallel to the collector line, and an elongated base line parallel to the collector line and positioned between the collector line and the base line. The emitter line, the base line, and the collector line are formed over fin structures.

According to certain illustrative examples, a Bipolar Junction Transistor (BJT) device includes a collector having an elongated conductive collector line and a first set of fin interconnect structures positioned between the metal collector line and fin structures of an underlying substrate. The BJT device also has a base having an elongated conductive base line parallel to the collector line and a second set of fin interconnect structures positioned between the base line and fin structures of the underlying substrate, the fin interconnect structures running perpendicular to the base lin. The BJT also has an emitter that includes an elongated emitter line parallel to the base line and having a width greater than that of the base line, the emitter line being connected to the second set of fin interconnect structures.

According to certain illustrative examples, a method for forming a Bipolar Junction Transistor device (BJT) includes forming a first set and a second set of fin structures on a substrate, each set comprising a two dimensional array wherein a length of the array is substantially greater than a width of the array, wherein the first and second sets of fin structures are doped with a first type of dopant, forming a third set of fin structures between the first and second set of fin structures, the third set comprising a two dimensional array wherein a length is substantially greater than a width of the array, wherein the third set of fin structures are doped with a second type of dopant, forming fin interconnect structures over the fin structures, the fin interconnect structures running along a width of the arrays, forming a collector line above the first set of fin structures, the collector line being perpendicular to the fin interconnect structures, forming a base line above the second set of fin structures, the base line being parallel to the collector line, and forming an emitter line above the third set of fin structures, the emitter line being parallel to the base line, the width of the emitter line being within a range of about 0.2 micrometers and 0.7 micrometers.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A Bipolar Junction Transistor (BJT) comprising:
   an elongated collector line;
   an elongated emitter line parallel to the elongated collector line; and
   an elongated base line parallel to the elongated collector line and positioned between the elongated collector line and the elongated emitter line;
   wherein the elongated emitter line, the elongated base line, and the elongated collector line are formed over fin interconnect structures that run perpendicular to the elongated collector line, the fin interconnect structures formed over elongated fin structures that run parallel to the elongated collector line.

2. The BJT device of claim 1, further comprising:
   a first set of fin structures formed underneath the elongated collector line and electrically connected to the elongated collector line; and
   a first set of elongated fin interconnects that run perpendicular to the elongated collector line and connect the first set of fin structures.

3. The BJT device of claim 2, further comprising:
   a second set of fin structures formed underneath the elongated base line and electrically connected to the elongated base line; and
   a second set of elongated fin interconnects that run perpendicular to the elongated base line and connect the second set of fin structures.

4. The BJT device of claim 3, further comprising:
   a third set of fin structures underneath the elongated emitter line and electrically connected to the elongated emitter line, wherein the third set of fin structures are connected to each other by the second set of elongated fin interconnects.

5. The BJT device of claim 4, wherein the first set of fin structures and the third set of fin structures are doped differently than the second set of fin structures.

6. The BJT device of claim 4, wherein the elongated fin interconnects are made of polysilicon.

7. The BJT device of claim 1, wherein a width of the elongated emitter line is substantially larger than a width of the elongated base line.

8. The BJT device of claim 1, wherein a width of the elongated emitter line is within a range of about 0.2 micrometers and 0.7 micrometers.

9. The BJT device of claim 1, further comprising:
   at least one additional elongated emitter line and at least one additional elongated base line, wherein the additional elongated emitter lines are positioned between additional elongated base lines.

10. The BJT device of claim 1, further comprising:
    an additional collector line positioned on an opposite side of the elongated emitter line and the elongated base line.

11. A Bipolar Junction Transistor (BJT) device comprising:
    a collector comprising: an elongated conductive collector line; and a first set of fin interconnect structures positioned between a metal collector line and a first array of fin structures of an underlying substrate;
    a base comprising: an elongated conductive base line parallel to the elongated conductive collector line; and a second set of fin interconnect structures positioned between the elongated conductive base line and a second array of fin structures of the underlying substrate, the second set of fin interconnect structures running perpendicular to the elongated conductive base line; and
    an emitter comprising an elongated emitter line parallel to the base line and having a width greater than that of the elongated conductive base line, the elongated emitter line being electrically connected to a third array of fin structures of the underlying substrate, the third array of fin structures being connected to the second array of fin structures through the second set of fin interconnect structures.

12. The BJT device of claim 11, wherein the device is structured so that electric current flows through the device in a direction that is perpendicular to the elongated emitter line.

13. The BJT device of claim 11, wherein the fin structures underneath the elongated emitter line are doped differently than the fin structures underneath the elongated conductive base line.

14. The BJT device of claim 11, further comprising:
    an additional elongated base line adjacent the elongated emitter line and on an opposite side of the elongated conductive base line; and an additional elongated conductive collector line positioned such that the elongated emitter line and elongated conductive base lines are between the two elongated conductive collector lines.

15. The BJT device of claim 14, further comprising:
    additional emitter lines and base lines positioned such that each elongated emitter line includes one of the elongated conductive base lines on both sides running parallel to that elongated emitter line.

16. The BJT device of claim 11, wherein a width of the elongated emitter line is within a range of about 0.2 micrometers and 0.7 micrometers.

17. The BJT device of claim 11, wherein the first set of fin interconnect structures are made of polysilicon.

18. A device comprising:
a first array of fin structures on a substrate, wherein a length of the first array is greater than a width of the first array, and wherein the fin structures of the first array are doped with a first type of dopant;
a second array of fin structures on the substrate, wherein a length of the second array is greater than a second of the first array, and wherein the fin structures of the second array are doped with the type of dopant;
a third array of fin structures between the first and second set of fin structures, wherein the fin structures of the third array are doped with a second type of dopant different from the first type of dopant;
a first array of gate-like fin interconnect structures over the first array of fin structures;
a second array of gate-like fin interconnect structures over the second and third arrays of fin structures, the fin interconnect structures running along a width of the arrays;
a collector line above the first array of fin structures, the collector line being perpendicular to the fin interconnect structures;
a base line above the second array of fin structures, the base line being parallel to the collector line; and
an emitter line above the third array of fin structures, the emitter line being parallel to the base line.

19. The device of claim 18, wherein the width of the emitter line is within a range of about 0.2 micrometers and 0.7 micrometers.

20. The device of claim 18, wherein the gate-like fin interconnect structures connect between the base line and the emitter line, and do not connect to the gate-like structures underneath the collector line.

* * * * *